(12) United States Patent
West

(10) Patent No.: US 6,683,505 B2
(45) Date of Patent: Jan. 27, 2004

(54) HIGH SPEED VOLTAGE CONTROLLED OSCILLATOR

(75) Inventor: Jeffrey Alma West, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/939,326

(22) Filed: Aug. 24, 2001

(65) Prior Publication Data

US 2003/0038685 A1 Feb. 27, 2003

(51) Int. Cl.$^7$ .............................................. H03B 24/00
(52) U.S. Cl. ........................ 331/57; 331/34; 331/177 R; 331/185
(58) Field of Search ................................ 331/34, 36 C, 331/57, 177 R, 177 V, 185, 186

(56) References Cited

U.S. PATENT DOCUMENTS

| 4,947,140 A | 8/1990 | Tateishi ........................ 331/113 |
| 4,975,662 A | 12/1990 | Takeuchi ...................... 331/111 |
| 5,345,196 A | 9/1994 | Mahant-Shetti et al. .... 331/111 |
| 5,359,301 A * | 10/1994 | Candage ....................... 331/57 |
| 5,418,497 A | 5/1995 | Martin .......................... 331/48 |
| 5,467,060 A | 11/1995 | Miyashita ..................... 331/74 |
| 5,495,207 A | 2/1996 | Novof |
| 5,563,553 A | 10/1996 | Jackson ........................ 331/57 |
| 5,596,302 A | 1/1997 | Mastrocola et al. .......... 331/57 |
| 6,011,443 A | 1/2000 | Xu et al. |
| 6,014,062 A | 1/2000 | Bryan et al. ................... 331/57 |
| 6,037,842 A | 3/2000 | Bryan et al. ................... 331/57 |

* cited by examiner

Primary Examiner—David C. Mis
(74) Attorney, Agent, or Firm—Peter Zawilski

(57) ABSTRACT

The invention provides an improved high speed voltage controlled oscillator (VCO) buffer cell, with consistent output performance. According to one embodiment of the invention, the cell comprises a differential pair of transistors and a current mirror circuit. The differential pair has input terminals for receiving input signals and output terminals for providing differential voltage swing in response to the input signals. The current mirror circuit is operably coupled to the pair of transistors and is configured to receive a first external reference current and provide a mirrored current to an active one of the transistors. The differential voltage swing has a frequency which is determined based on the reference current. In a specific embodiment of the invention, the pair of transistors of the cell is bipolar transistors, and the current mirror circuit is composed of CMOS transistors.

20 Claims, 2 Drawing Sheets

HIGH SPEED VOLTAGE CONTROLLED OSCILLATOR

BACKGROUND OF THE INVENTION

The invention generally relates to electronic circuits, and more particularly to voltage controlled oscillators (VCOs).

VCOs are well known devices and have been used in many applications, e.g., in generating frequency signals for networking and communication systems. Most VCOs are single ended or differential CMOS, e.g, single ended CMOS VCOs, differential CMOS VCOs and bipolar VCOs. As networking and communication systems are playing increasingly more important roles in the present information age, demands for high speed VCOs are significantly increased to keep up with the speed of these systems. High speed VCOs typically are implemented exclusively with bipolar transistors. These VCOs, however, suffer from serious drawbacks. In particular, the outputs of these VCOs do not provide consistent performance. These VCOs change their output frequency swings depending on the speed of the input signals. Such variations at the output frequency swings seriously affect the overall performance of circuits in which these VCOs are used.

Therefore, there is a need for an improved high speed VCO that delivers consistent output performance.

SUMMARY OF THE INVENTION

The invention provides an improved high speed VCO. According to one embodiment of the invention, a VCO buffer cell is provided. The cell comprises a differential pair of transistors having input terminals for receiving input signals and output terminals for providing differential voltage swing in response to the input signals; and a current mirror circuit, operably coupled to the pair of transistors, that is configured to receive a first external reference current and provide a mirrored current to an active one of the transistors. The differential voltage swing has a frequency which is determined based on the reference current.

According to one aspect of a specific embodiment of the invention, the current mirror circuit of the cell includes a first current mirror that is configured to receive the first external reference current and provide the mirrored current; and a second current mirror, operably coupled to the first current mirror, that is configured to receive the mirrored current, provide it to the active one of the transistors and provide a reference voltage such that the output of the active transistor is equal to a mirrored value of the reference voltage. The current mirror circuit allows self-regulation of the output frequency swings of the VCO buffer cell, without regard to the changes in the speed of the input signals received by the cell. This ensures consistent performance at the cell output.

According to another aspect of the specific embodiment of the invention, the pair of transistors of the cell is bipolar transistors, and the current mirror circuit is composed of MOS transistors.

According to a further aspect of the specific embodiment of the invention, the cell further comprises two emitter followers each operably coupled to the output of a respective one of the transistors for providing voltage level shifting to the differential voltage swing.

According to a still further aspect of the specific embodiment of the invention, the cell further comprises two capacitive circuits each coupled between the output of a respective one of the transistors and a predetermined voltage level for allowing adjustment of the frequency of the differential voltage swing and for providing voltage clamping to the outputs of the transistors.

The invention also provides a multi-stage ring oscillator having a plurality of the VCO buffer cells.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
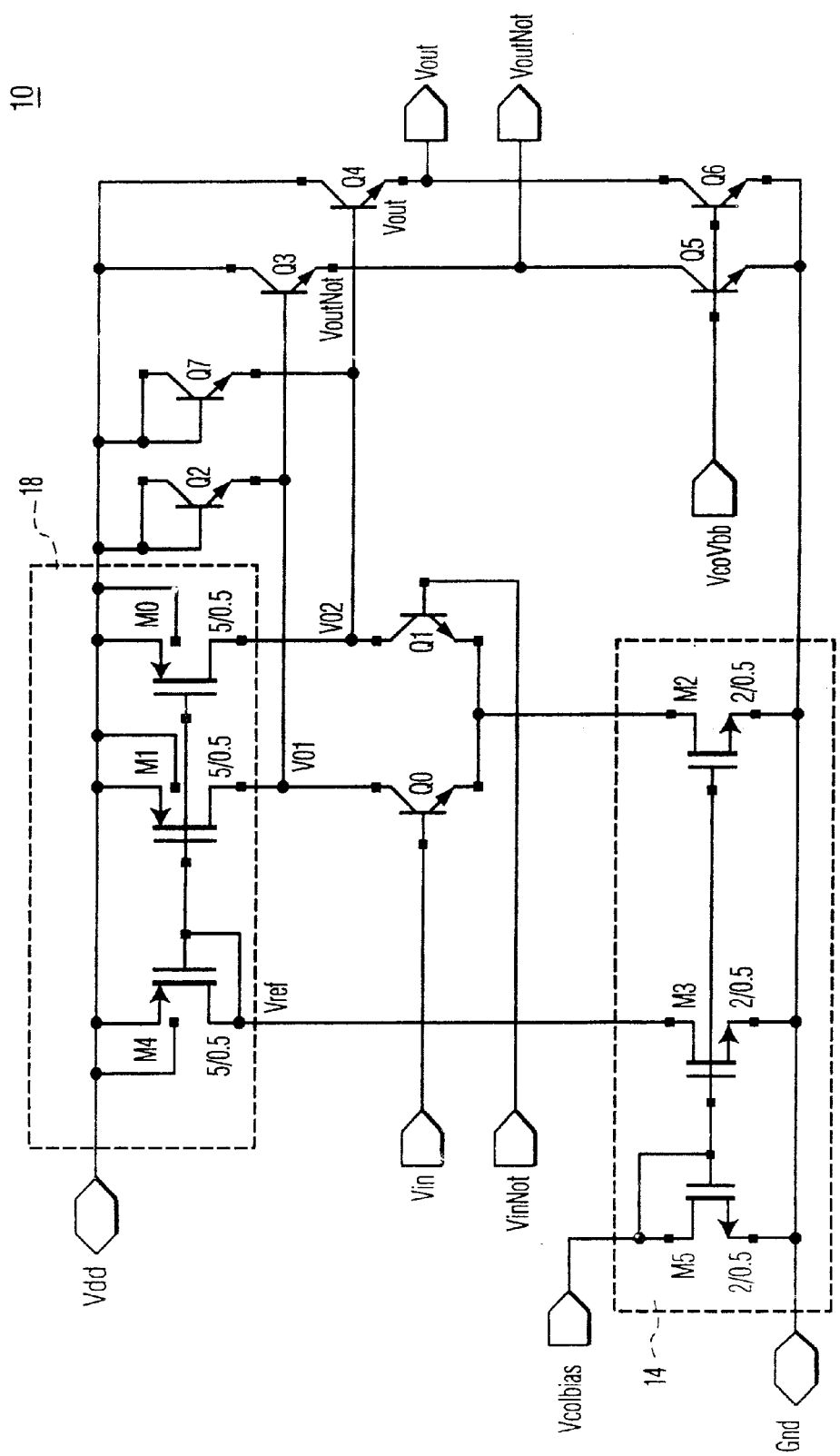
FIG. 1 is a schematic diagram of a VCO buffer cell according to one embodiment of the present invention.

FIG. 1 is a schematic diagram of a VCO buffer cell 10 according to an embodiment of the invention. As illustrated in FIG. 1, VCQ buffer cell 10 includes an input differential pair of transistors Q0 and Q1 and a current mirror circuit composed of a first current mirror 14 and a second current mirror 18. First current mirror 14 is composed of transistors M2, M3 and M5; and second current mirror 18 is composed of transistors M0, M1 and M4. Cell 10 also includes two emitter followers each composed of one of bipolar transistors Q3 and Q4, which are respectively connected to the outputs V1 and V2 of differential pairs Q0 and Q1. Cell 10 additionally includes pull-down transistors Q5 and Q6, and transistors Q2 and Q7, which are configured to function as capacitors for adjusting the output frequency of cell 10. A reference current is supplied via Vcolbias. This current is mirrored by current mirror 14 and flows through transistors M2 and M3. This current may be adjusted to control the output frequency or the speed of VCO buffer cell, so that large current will cause the speed to increase, while small current will cause the speed to decrease. The current flowing through transistor M3 is mirrored again by current mirror 18 and flows through either transistor Q0 or Q1, depending on which of the two transistors is switched on. The current mirror circuit allows self-regulation of the output frequency swings of the VCO buffer cell, without regard to the changes in the speed of the input signals received by the cell. This ensures consistent performance at the cell output.

In FIG. 1, if Vin is active and VinNot is inactive, then transistor Q0 is switched on while transistor Q1 remains off, and current flows through transistors M1 and Q0. The current in transistor M1 causes the output voltage Vo1 of transistor Q0 to be in a low state and equal to a value which is the mirror of a reference voltage Vref at the drain terminal of transistor M4. Vref is equal to Vdd−Vth, Vth being the threshold voltage of transistor M4. On the other hand, since no current flows through transistors M0 or Q1, the output voltage Vo2 of transistor Q1 is in a high state and equal to Vdd. The emitter voltage VoutNot of transistor Q3, which is configured as an emitter follower, essentially follows its base voltage Vo1 with an offset. Thus, VoutNot is also in a low state as Vo1 and equal to Vdd−Vth−Vbe1, where Vbe1 is the voltage across the base and emitter of transistor Q3. Similarly, the emitter voltage Vout of transistor Q4 essentially follows its base voltage Vo2 with an offset. Thus, Vout is also in a high state as Vo2 and equal to Vdd−Vbe2, where Vbe2 is the voltage across the base and emitter of transistor Q4. In this specific embodiment of the invention, Vbe1 is equal to Vbe2. The emitter followers Q3 and Q4 are used for level shifting for the next stage of the VCO buffer cell.

In FIG. 1, if Vin is inactive while VinNot is active, the reverse is true. In other words, Vo1=Vdd, Vo2=Vdd−Vth, VoutNot=Vdd−Vbe1 and Vout=Vdd−Vth−Vbe2.

In the above specific embodiment of the invention, if Vin is greater than VinNot by more than 26 mV, then vast current flows through transistor Q0. Likewise, if VinNot is greater than Vin by more than 26 mV, then vast current flows through transistor Q1. If id Vin=VinNot, then about 50% of the current flows through each of transistors Q0 and Q1.

In this embodiment of the invention, if neither one of transistors Q0 and Q1 is switched on, then there is no current flowing through either of the two transistors. In such a case, Vo1=Vo2=Vdd, i.e., both are in high state. The outputs of VCO buffer cell 10 are also in high state, i.e., VoutNot=Vdd−Vbe1 and Vout=Vdd−Vbe2.

In FIG. 1, bipolar transistors Q2 and Q7 are configured as diodes and function as capacitors. They are placed at the outputs of differential pair of transistors Q0 and Q1 as capacitive load. They also allow adjustment of the output frequencies of VCO buffer cell 10, with large capacitance slowing the oscillator. Transistors Q2 and Q7 further provide clamping functions to the output voltages Vo1 and Vo2 at their low state, so that the voltage across the base and collector of transistors Q2 and Q7 are equal to the threshold voltage Vth of transistor M4 plus the voltage across the base and emitter of transistors Q3 and Q4, respectively. Large capacitance values will slow oscillators.

Transistors Q5 and Q6 are pull-down transistors that discharge current from transistors Q3 and Q4, respectively. Another reference current is supplied to cell 10 via VcoVbb for operating transistors Q5 and Q6. Alternatively, resistors may be used in place of transistors Q5 and Q6 and the reference current supplied at VcoVbb.

Figure 2:
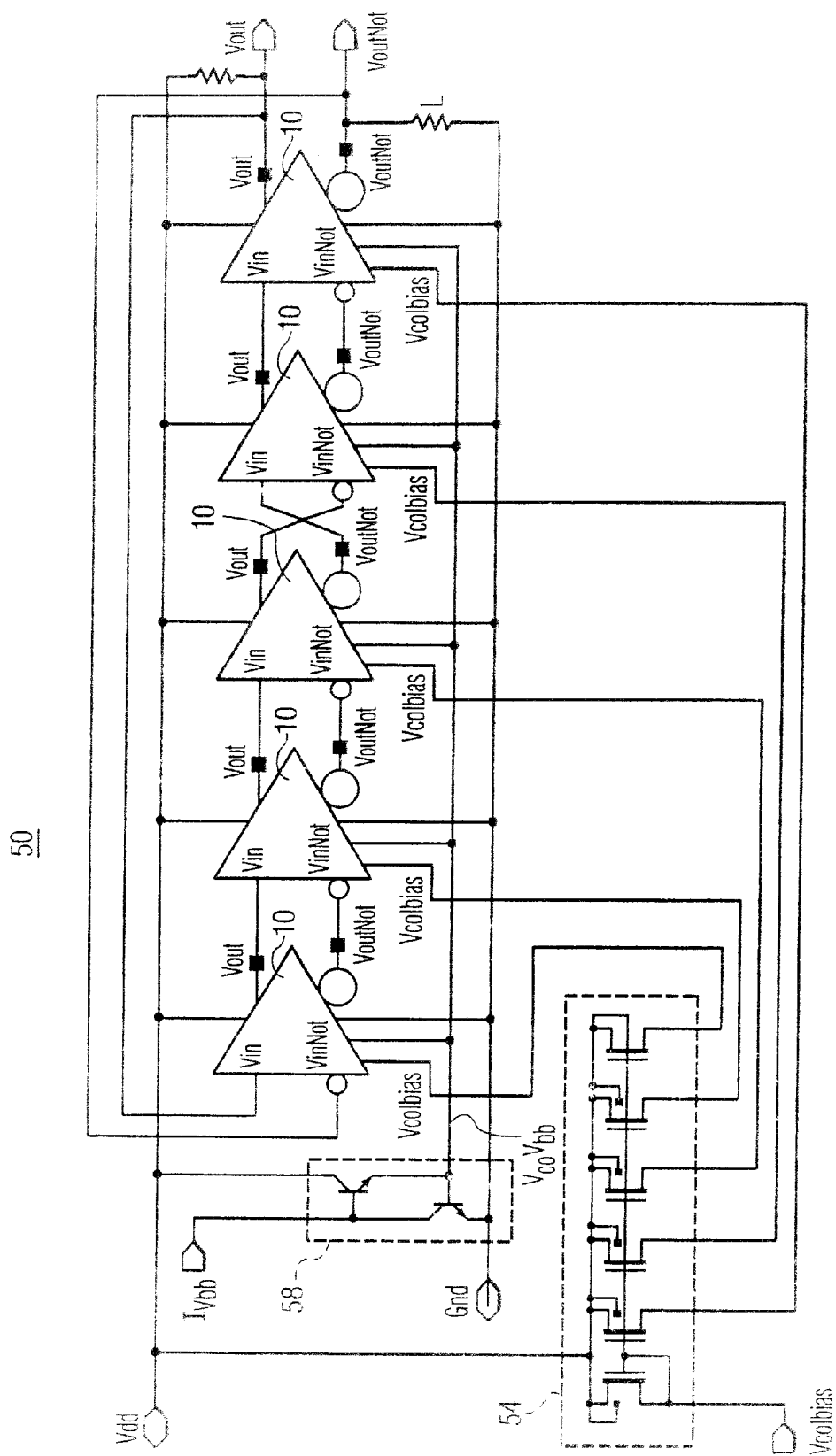
FIG. 2 shows a five-stage ring oscillator using the VCO buffer cell of FIG. 1.

FIG. 2 shows a five-stage ring oscillator 50 according to one embodiment of the invention. Oscillator 50 includes five VCO buffer cells 10, a current mirror 54 and a transistor circuit 58. A first reference current is supplied to an input terminal Vcolbias of current mirror 54, which provides a mirrored current to five cells 10 via their respective Vcolbias terminals. This current controls the output frequency of oscillator 50. A second reference current is supplied to transistor circuit 58 via an input terminal lvbb. Transistor circuit 58 provides current mirroring functions and causes an output current to be provided to the five cells 10 via their respective input terminals VcoVbb.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as falling within the spirit and scope of the appended claims.

What is claimed is:

1. A voltage controlled oscillator buffer cell, comprising:
    a differential pair of transistors having input terminals for receiving input signals and output terminals for providing differential voltage swing in response to the input signals; and
    a current mirror circuit, operably coupled to the pair of transistors, that is configured to receive a first external reference current and provide a mirrored current to an active one of the transistors;
    wherein the reference current is adjusted to control the differential voltage swing, which has a frequency that is determined based on the reference current.

2. The cell of claim 1, wherein the current mirror circuit includes:
    a first current mirror that is configured to receive the first external reference current and provide the mirrored current; and
    a second current mirror, operably coupled to the first current mirror, that is configured to receive the mirrored current, provide it to the active one of the transistors and provide a reference voltage such that the output of the active transistor is equal to a mirrored value of the reference voltage.

3. The cell of claim 1, wherein the pair of transistors is bipolar transistors.

4. The cell of claim 3, wherein the current mirror circuit is composed of MOS transistors.

5. The cell of claim 1, further comprising two emitter followers each operably coupled to the output of a respective one of the transistors for providing voltage level shifting to the differential voltage swing.

6. The cell of claim 1, further comprising two capacitive circuits each coupled between the output of a respective one of the transistors and a predetermined voltage level for allowing adjustment of the frequency of the differential voltage swing and for providing voltage clamping to the outputs of the transistors.

7. The cell of claim 1, wherein the current mirror sets differential voltage swing level to approximately 0.6V.

8. A voltage controlled oscillator buffer cell, comprising:
    a differential pair of bipolar transistors having input terminals for receiving input signals and output terminals for providing differential voltage swing in response to the input signals; and
    a current mirror circuit, composed of MOS transistors and operably coupled to the pair of transistors, that is configured to receive a first external reference current and provide a mirrored current to an active one of the transistors;
    wherein the reference current is adjusted to control the differential voltage swing, which has a frequency that is determined based on the reference current.

9. The cell of claim 8, wherein the current mirror circuit includes:
    a first current mirror that is configured to receive the first external reference current and provide the mirrored current; and
    a second current mirror, operably coupled to the first current mirror, that is configured to receive the mirrored current, provide it to the active one of the differential pair of transistors and provide a reference voltage such that the output of the active transistor is equal to a mirrored value of the reference voltage.

10. The cell of claim 8, further comprising two emitter followers each operably coupled to the output of a respective one of the transistors for providing voltage level shifting to the differential voltage swing.

11. The cell of claim 10, further comprising two capacitive circuits each coupled between the output of a respective one of the transistors and a predetermined voltage level for allowing adjustment of the frequency of the differential voltage swing and for providing voltage clamping to the outputs of the transistors.

12. A voltage controlled oscillator buffer cell, comprising:

differential means for providing a differential voltage swing in response to input signals, the differential means including a differential pair of transistors having input terminals for receiving the input signals and output terminals for providing the differential voltage swing; and current mirror means for receiving a first external reference current and providing a mirrored current to an active one of the transistors of the differential means;

wherein the differential voltage swing has a frequency which is determined based on the reference current.

13. The cell of claim 12, wherein the current mirror means includes:

means for receiving the first external reference current and providing the mirrored current; and means for receiving the mirrored current, providing it to the active one of the transistors and providing a reference voltage such that the output of the active transistor is equal to a mirrored value of the reference voltage.

14. The cell of claim 12, further comprising means for providing voltage level shifting to the differential voltage swing.

15. The cell of claim 12, further comprising means for allowing adjustment of the frequency of the differential voltage swing and for providing voltage clamping to the outputs of the transistors.

16. A muti-stage ring oscillator, comprising:

a plurality of voltage controlled oscillator buffer cells, each cell including:

a differential pair of transistors having input terminals for receiving input signals and output terminals for providing differential voltage swing in response to the input signals; and a current mirror circuit, operably coupled to the pair of transistors, that is configured to receive a first external reference current and provide a minored current to an active one of the transistors;

wherein the reference current is adjusted to control the differential voltage swing, which has a frequency that is determined based on the reference current.

17. The oscillator of claim 16, wherein the current mirror circuit includes:

a first current mirror that is configured to receive the first external reference current and provide the mirrored current; and a second current mirror, operably coupled to the first current mirror, that is configured to receive the mirrored current, provide it to the active one of the transistors and provide a reference voltage such that the output of the active transistor is equal to a mirrored value of the reference voltage.

18. The oscillator of claim 16, wherein the pair of transistors is bipolar transistors and the current mirror circuit is composed of MOS transistors.

19. The oscillator of claim 16, further comprising two emitter followers each operably coupled to the output of a respective one of the transistors for providing voltage level shifting to the differential voltage swing.

20. The oscillator of claim 16, further comprising two capacitive circuits each coupled between the output of a respective one of the transistors and a predetermined voltage level for allowing adjustment of the frequency of the differential voltage swing and for providing voltage clamping to the outputs of the transistors.

* * * * *